(12) United States Patent
Hung et al.

(10) Patent No.: US 11,324,138 B2
(45) Date of Patent: May 3, 2022

(54) SYSTEMS AND METHODS FOR MINIMIZING AIRFLOW BYPASS AND RECIRCULATION THROUGH A CABLE CHANNEL

(71) Applicant: Dell Products L.P., Round Rock, TX (US)

(72) Inventors: Hsiang-Yin Hung, Taipei (TW); Chun-Yang Tseng, Taipei (TW); Yi-Pai Chu, Taoyuan (TW)

(73) Assignee: Dell Products L.P., Round Rock, TX (US)

( * ) Notice: Subject to any disclaimer, the term of this patent is extended or adjusted under 35 U.S.C. 154(b) by 57 days.

(21) Appl. No.: 16/914,642

(22) Filed: Jun. 29, 2020

(65) Prior Publication Data

US 2021/0410324 A1 Dec. 30, 2021

(51) Int. Cl.
*H05K 7/20* (2006.01)
*H05K 7/14* (2006.01)

(52) U.S. Cl.
CPC ....... *H05K 7/20145* (2013.01); *H05K 7/1491* (2013.01); *H05K 7/20736* (2013.01)

(58) Field of Classification Search
CPC .......... H04Q 1/06; H04Q 1/062; H04Q 1/021; H04Q 1/131; G06F 2200/1639; H05K 7/1491; H02G 15/013; H02G 15/23; H02G 3/088; F28D 15/0233

USPC ...... 361/826, 679.49, 827; 248/56, 68.1, 49; 174/153 G, 100, 97, 650, 659, 68.1, 77 R
See application file for complete search history.

(56) References Cited

U.S. PATENT DOCUMENTS

| 5,813,243 A * | 9/1998 | Johnson ................... G06F 1/20 361/678 |
| 2004/0121639 A1* | 6/2004 | Yaworski ........... H01R 13/5216 439/276 |
| 2009/0181577 A1* | 7/2009 | Zahnen .............. H01R 13/5205 439/604 |
| 2018/0343765 A1* | 11/2018 | Lin ..................... H05K 7/20727 |

FOREIGN PATENT DOCUMENTS

WO  WO-2014005918 A2 *  1/2014  ........... G02B 6/4444

* cited by examiner

*Primary Examiner* — Mandeep S Buttar
(74) *Attorney, Agent, or Firm* — Jackson Walker L.L.P.

(57) ABSTRACT

An information handling system may include a chassis, a cable channel formed within the chassis, and a sleeve within the cable channel and configured to minimize airflow recirculation in the chassis via the cable channel, the sleeve comprising a cable passage opening for passage of a cable and an obstruction configured to create a seal at the cable passage opening in the absence of the cable from the cable passage opening, such seal restricting airflow through the cable passage opening.

21 Claims, 6 Drawing Sheets

SYSTEMS AND METHODS FOR MINIMIZING AIRFLOW BYPASS AND RECIRCULATION THROUGH A CABLE CHANNEL

TECHNICAL FIELD

The present disclosure relates in general to information handling systems, and more particularly to mounting a sleeve in the cable channel of an information handling system to cause a fluidic seal between the cable channel and the exterior of the cable channel, while including sealable openings for passage of cables.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

As processors, graphics cards, random access memory (RAM) and other components in information handling systems have increased in clock speed and power consumption, the amount of heat produced by such components as a side-effect of normal operation has also increased. Often, the temperatures of these components need to be kept within a reasonable range to prevent overheating, instability, malfunction and damage leading to a shortened component lifespan. Accordingly, cooling fans and blowers, referred to generally herein as "air movers," have often been used in information handling systems to cool information handling systems and their components.

An information handling system chassis may also include a cable channel for receiving cables running within the chassis. Such cable channels may be a source of airflow bypass or recirculation, which may reduce an effectiveness of the cooling system of the information handling system. While approaches have been used to minimize such airflow bypass or recirculation, such approaches may fail to meet thermal requirements as information handling systems continue to increase in their levels of heat generation.

SUMMARY

In accordance with the teachings of the present disclosure, the disadvantages and problems associated traditional approaches to mounting air movers in an information handling system may be substantially reduced or eliminated.

In accordance with embodiments of the present disclosure, an information handling system may include a chassis, a cable channel formed within the chassis, and a sleeve within the cable channel and configured to minimize airflow recirculation in the chassis via the cable channel, the sleeve comprising a cable passage opening for passage of a cable and an obstruction configured to create a seal at the cable passage opening in the absence of the cable from the cable passage opening, such seal restricting airflow through the cable passage opening.

In accordance with these and other embodiments of the present disclosure, a sleeve configured to engage with a cable channel in order to minimize airflow recirculation in a chassis via a cable channel of the chassis may include a cable passage opening for passage of a cable and an obstruction configured to create a seal at the cable passage opening in the absence of the cable from the cable passage opening, such seal restricting airflow through the cable passage opening.

In accordance with these and other embodiments of the present disclosure, a method for forming a sleeve configured to engage with a cable channel in order to minimize airflow recirculation in a chassis via a cable channel of the chassis may include forming in the sleeve a cable passage opening for passage of a cable and forming an obstruction configured to create a seal at the cable passage opening in the absence of the cable from the cable passage opening, such seal restricting airflow through the cable passage opening.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Preferred embodiments and their advantages are best understood by reference to FIGS. 1 through 5B, wherein like numbers are used to indicate like and corresponding parts.

For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network storage device, or any other suitable device and may vary in size, shape, performance, functionality, and price. The information handling system may include memory, one or more processing resources such as a central processing unit (CPU) or hardware or software control logic. Additional components or the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, information handling resources may broadly refer to any component system, device or apparatus of an information handling system, including without limitation processors, buses, memories, input-output devices and/or interfaces, storage resources, network interfaces, motherboards, integrated circuit packages; electro-mechanical devices (e.g., air movers), displays, and power supplies.

Figure 1:
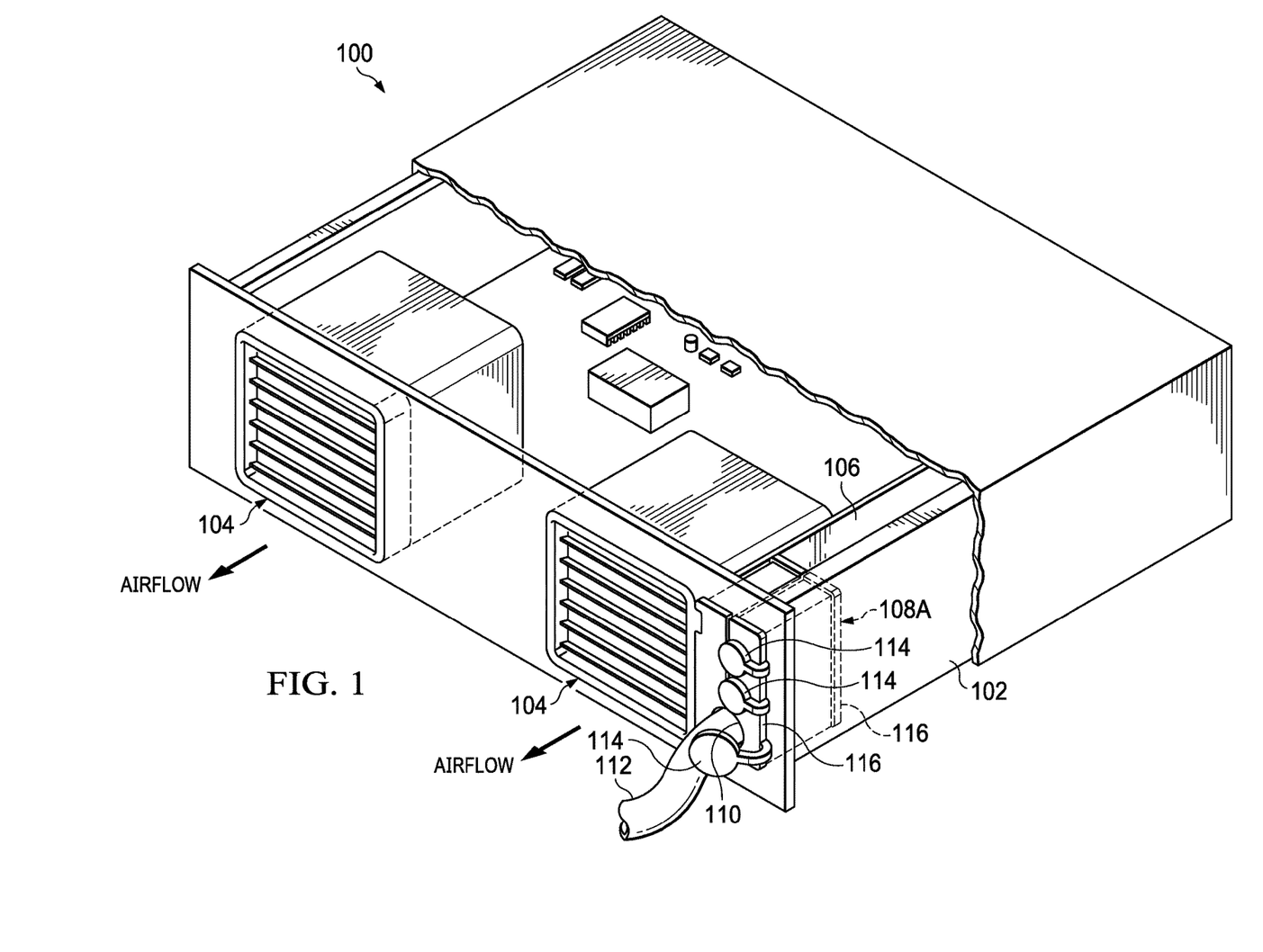
FIG. 1 illustrates an example information handling system having one or more air mover assemblies for cooling information handling resources and a cable channel for receiving cables from external the cable channel, in accordance with the present disclosure.
Figure 2:
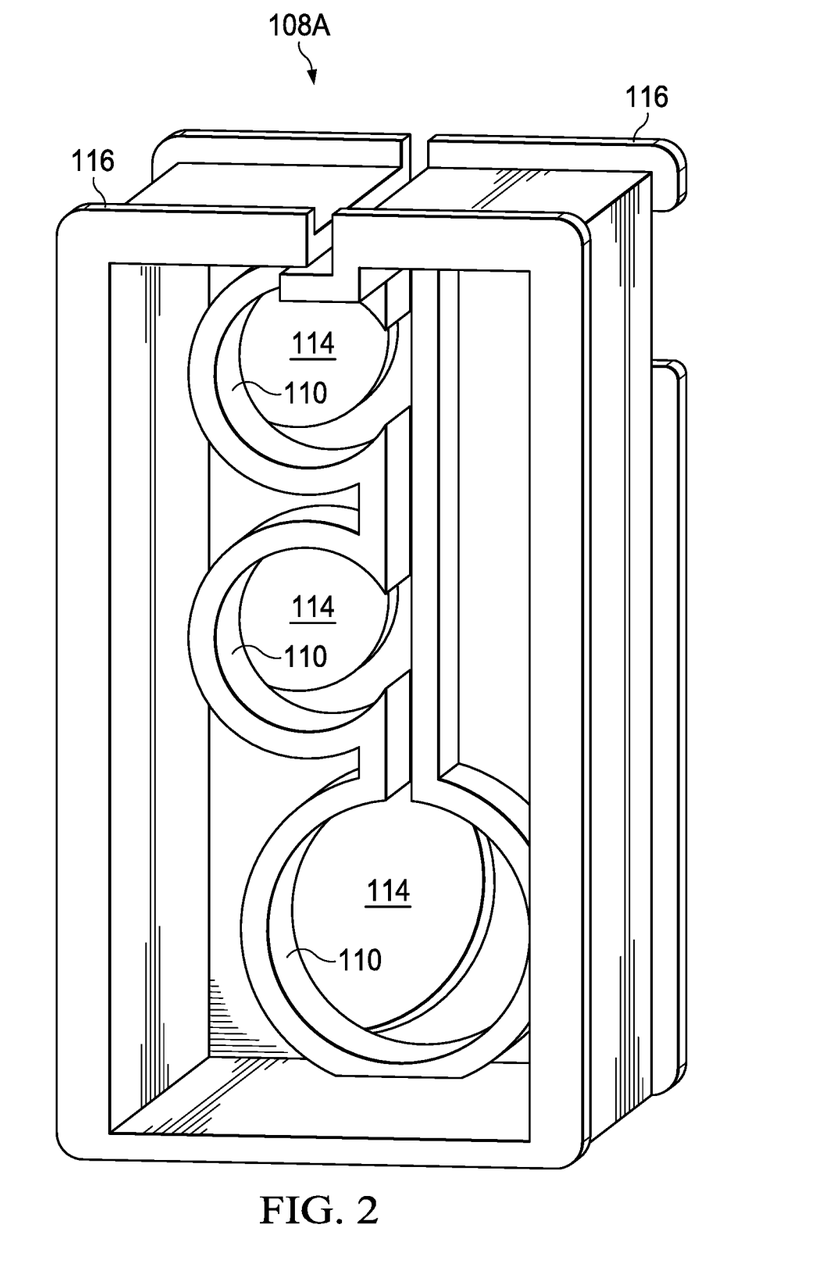
FIG. 2 illustrates a view of a rear of an example sleeve for use in a cable channel of the information handling system depicted in FIG. 1, in accordance with the present disclosure.

FIG. 1 illustrates a block diagram of an example information handling system 100 having one or more air mover assemblies 104 for cooling information handling resources and a cable channel 106 for receiving cables 112 from external to cable channel 106 of information handling system 100, in accordance with the present disclosure.

In some embodiments, an information handling system 100 may comprise a server chassis configured to house a plurality of servers or "blades." In other embodiments, information handling system 100 may comprise a personal computer (e.g., a desktop computer, laptop computer, mobile computer, and/or notebook computer). In yet other embodiments, information handling system 100 may comprise a storage enclosure configured to house a plurality of physical disk drives and/or other computer-readable media for storing data.

As depicted in FIG. 1, information handling system 100 may include a chassis 102 having a plurality of air mover assemblies 104, a cable channel 106, and one or more other components. Chassis 102 may be an enclosure that serves as a container for various information handling resources of information handling system 100, and may be constructed from steel, aluminum, plastic, and/or any other suitable material. Although the term "chassis" is used, chassis 102 may also be referred to as a case, cabinet, tower, box, enclosure, and/or housing.

Each of air mover assemblies 104 may be any mechanical or electro-mechanical system, apparatus, or device operable to move air and/or other gases. In certain embodiments, air mover assemblies 104 may draw cool air into chassis 102 from the outside, expel warm air from inside chassis 102, and/or move air across one or more heatsinks (not explicitly shown) internal to chassis 102 to cool one or more information handling resources of information handling system 100.

Although information handling system 100 is depicted as including two air mover assemblies 104, information handling system 100 may include any number of air mover assemblies 104. In addition, although a particular configuration of air mover assemblies 104 is depicted, air mover assemblies 104 may be configured in any suitable manner.

Cable channel 106 may comprise any suitable plenum or other structure which may be utilized to route one or more cables 112 (e.g., cables comprising electrically-conductive wires, optically-conductive wires, etc.) within chassis 102.

As shown in FIG. 1, a sleeve 108A may be located within cable channel 106. Sleeve 108A may be formed from any suitable material, including without limitation, rubber. Sleeve 108A may include one or more cable passage openings 110, one or more caps 114, and one or more sealing features 116. Although FIG. 1 depicts sleeve 108A placed at an end of cable channel 106, in some embodiments, sleeve 108A may be placed within cable channel 106 to minimize or prevent flow of air between the two portions of cable channel 106 separated by sleeve 108A.

Each cable passage opening 110 formed in sleeve 108A may be shaped (e.g., in terms of size and/or geometric shape) to allow passage of a suitable cable 112 through such cable passage opening 110. In some embodiments having a plurality of cable passage openings 110, cable passage openings 110 may be differently shaped (e.g., different in terms of size and/or geometric shape) to accommodate differently shaped (e.g., in terms of size and/or geometric shape) cables 112. To minimize airflow through a cable passage opening 110, it may be desirable that a cable 112 passing through a cable passage opening 110 cover as much of the cable passage opening 110 as possible.

Each cable passage opening 110 may have a respective cap 114 associated with such cable passage opening 110. Each cap 114 may be hingedly or otherwise flexibly coupled to sleeve 108A, such that a user (e.g., information handling system administrator or technician) may readily translate a cap 114 between a closed position in which such cap 114 fluidically seals its respective cable passage opening 110 and an open position such that a cable 112 may be passed through the respective cable passage opening 110.

Each sealing feature 116 may be shaped in a suitable manner such that the sealing feature 116 provides a fluidic seal between the two sides of sleeve 108A when sleeve 108A is present in cable channel 106. Accordingly, when sleeve 108A is properly engaged within cable channel 106 and each cable passage opening 110 is capped by its respective cap 114, sleeve 108A may provide a fluidic barrier that permits little or no flow of air through sleeve 108A.

To further illustrate the features of sleeve 108A described above, FIG. 2 illustrates a rear view of sleeve 108A (opposite of the front view of sleeve 108A shown in FIG. 1), in accordance with the present disclosure.

Figure 3:
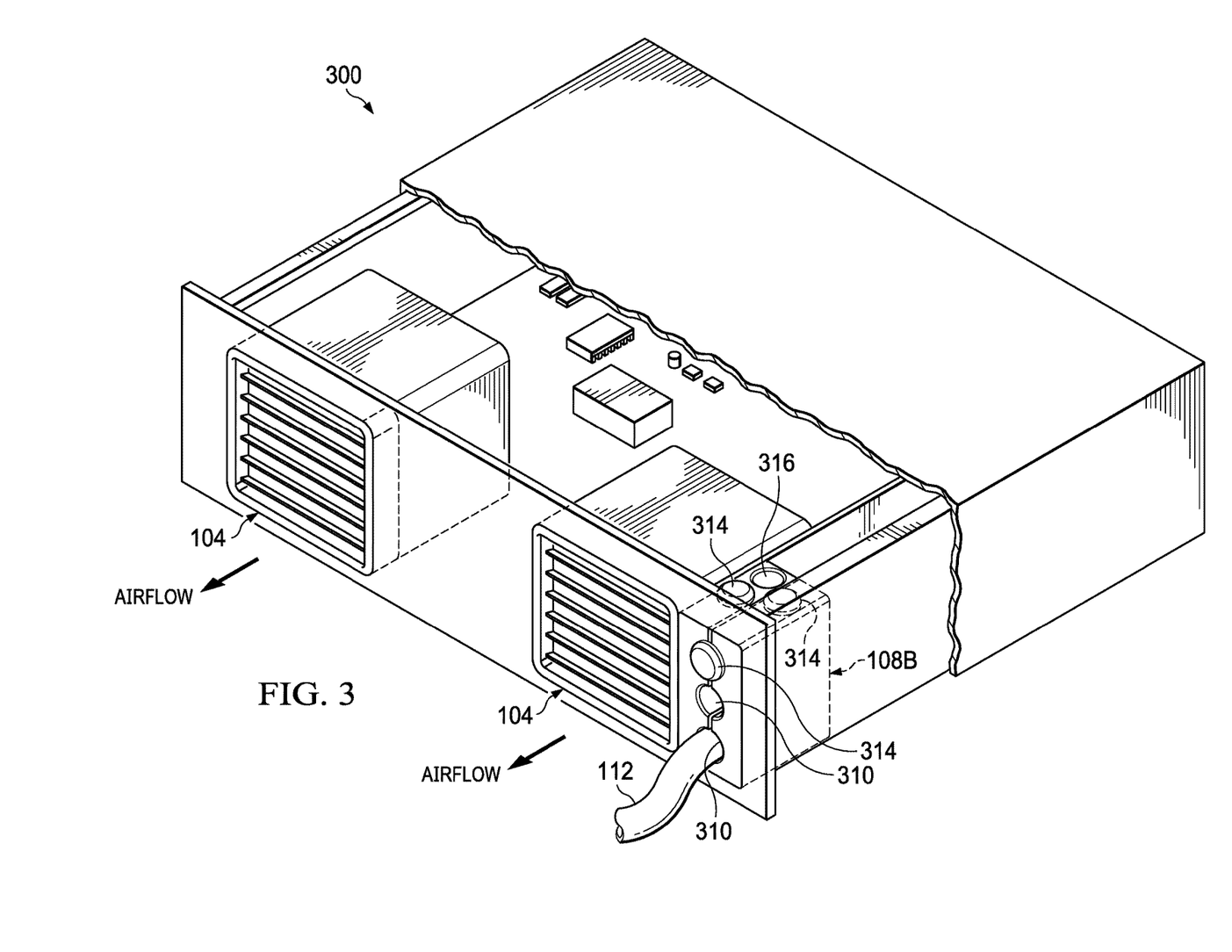
FIG. 3 illustrates another example information handling system having one or more air mover assemblies for cooling information handling resources and a cable channel for receiving cables from external to a chassis of the information handling system, in accordance with the present disclosure.

FIG. 3 illustrates a block diagram of another example information handling system 300 having one or more air mover assemblies 104 for cooling information handling resources and a cable channel 106 for receiving cables 112 within a chassis 102 of information handling system 300, in accordance with the present disclosure. Information handling system 300 shown in FIG. 3 may be similar in many respects to information handling system 100 shown in FIG. 1, and thus, only certain differences between information handling system 300 and information handling system 100 are described below. In particular, information handling system 300 may include sleeve 108B in lieu of sleeve 108A.

As shown in FIG. 3, a sleeve 108B may be located within cable channel 106. Sleeve 108B may include one or more cable passage openings 310, one or more removable plugs 314, and one or more storage holes 316. Although FIG. 3 depicts sleeve 108B placed at an end of cable channel 106, in some embodiments, sleeve 108B may be placed within cable channel 106 to minimize or prevent flow of air between the two portions of cable channel 106 separated by sleeve 108A.

Each cable passage opening 310 formed in sleeve 108B may be shaped (e.g., in terms of size and/or geometric shape) to allow passage of a suitable cable 112 through such cable passage opening 310. In some embodiments having a plurality of cable passage openings 310, cable passage openings 310 may be differently shaped (e.g., different in terms of size and/or geometric shape) to accommodate differently shaped (e.g., in terms of size and/or geometric shape) cables 112. To minimize airflow through a cable passage opening 310, it may be desirable that a cable 112 passing through a cable passage opening 310 cover as much of the cable passage opening 310 as possible.

Each plug 314 may be sized to be removably inserted into one or more of cable passage openings 310. In embodiments in which cable passage openings 310 are differently shaped, some of plugs 314 may correspondingly be differently shaped in order that each cable passage opening 310 has at least one corresponding-shaped plug 314. As indicated above, each plug 314 may be readily inserted into or removed from a cable passage opening 310, such that a user (e.g., information handling system administrator or technician) may readily insert a plug 314 into a cable passage opening 310 such that the plug 314 fluidically seals the respective cable passage opening 310 into which it is inserted, and readily remove a plug 314 from a cable passage opening 310 such that a cable 112 may be passed through the respective cable passage opening 310.

To prevent misplacement of a plug 314 when not inserted into cable passage opening 310, sleeve 108B may include one or more storage holes 316, each configured to house a plug 314.

Although FIG. 3 does not depict sleeve 108B as including sealing features such as sealing features 116 shown in FIG. 1, in some embodiments, sleeve 108B may include the same or similar features having the same or similar functionality.

Figure 4A:
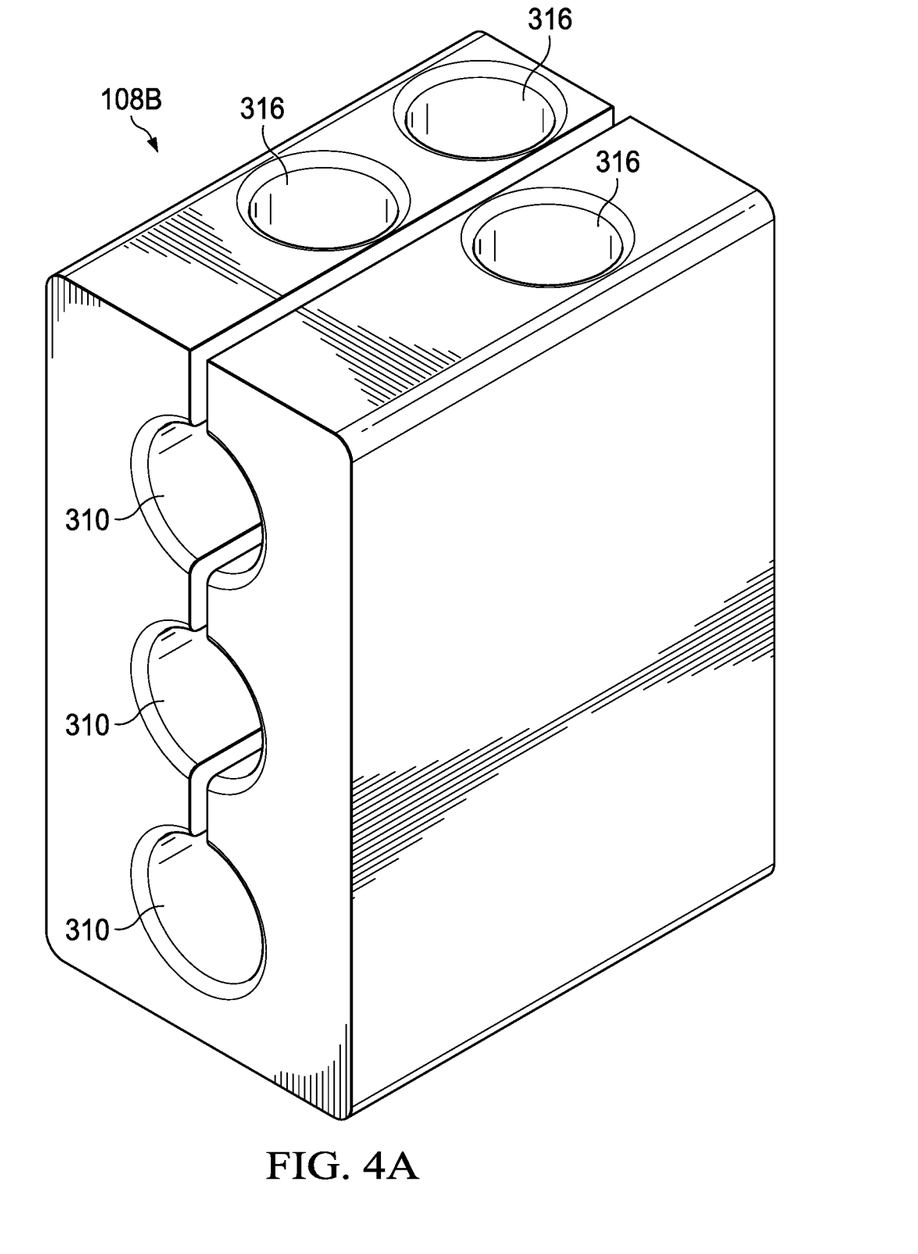
FIG. 4A illustrates a view of a top and front of an example sleeve for use in a cable channel of the information handling system depicted in FIG. 3, in accordance with the present disclosure.
Figure 4B:
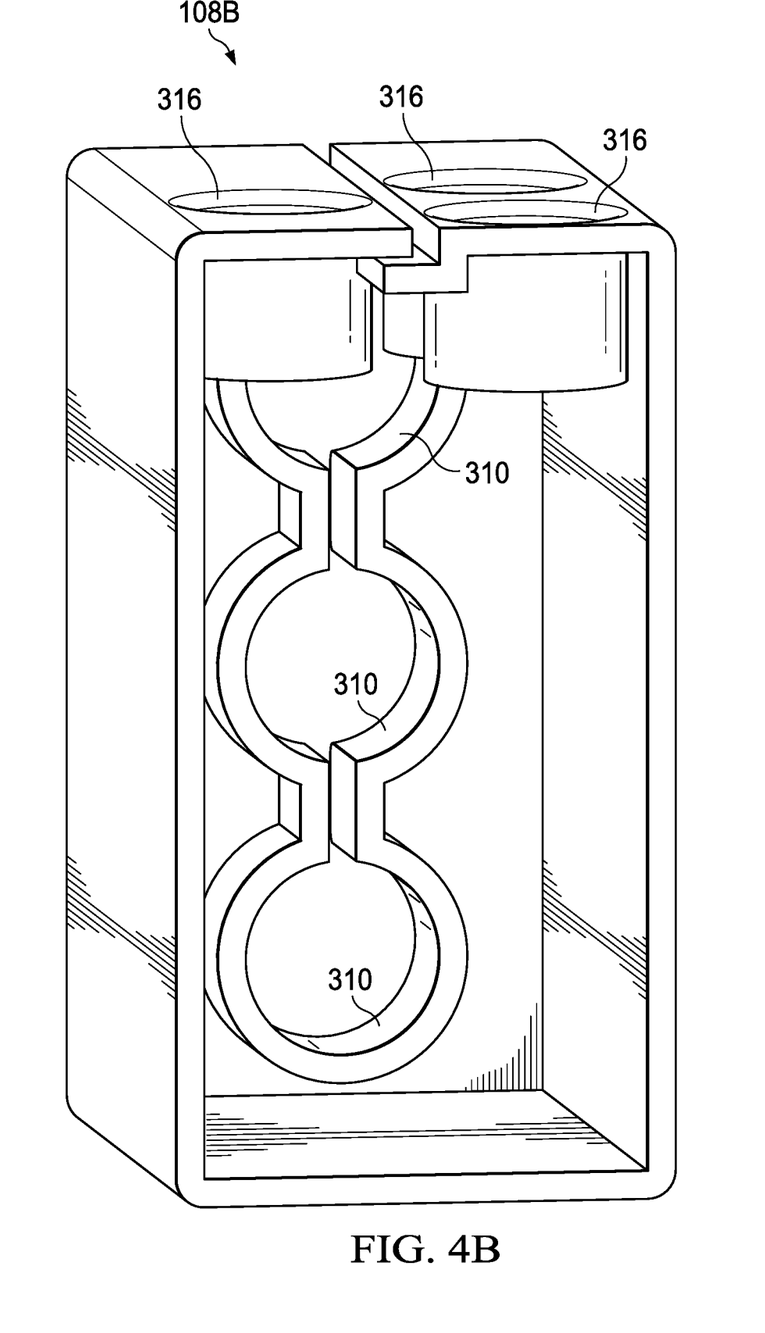
FIG. 4B illustrates a view of a rear of an example sleeve for use in a cable channel of the information handling system depicted in FIG. 3, in accordance with the present disclosure.

To further illustrate the features of sleeve 108B described above, FIG. 4A illustrates a view showing the top and front of sleeve 108B, while FIG. 4B illustrates a rear view of sleeve 108B (opposite of the front view of sleeve 108B shown in FIG. 4A), in accordance with the present disclosure.

Figure 5A:
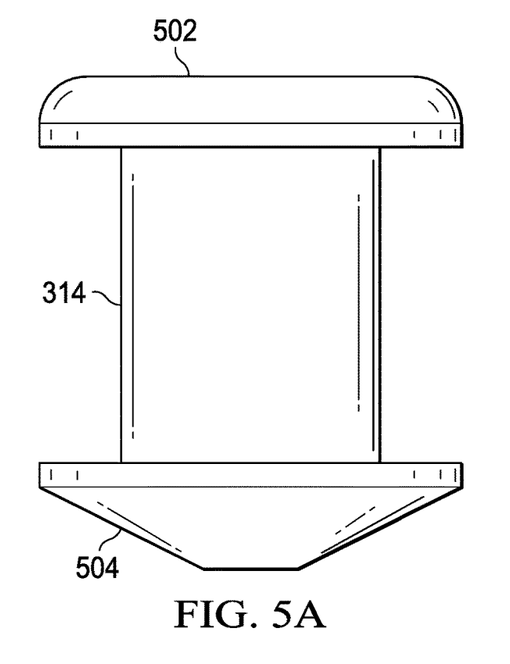
FIG. 5A illustrates a side elevation view of an example plug for use in the sleeve shown in FIGS. 3, 4A, and 4B, in accordance with the present disclosure.
Figure 5B:
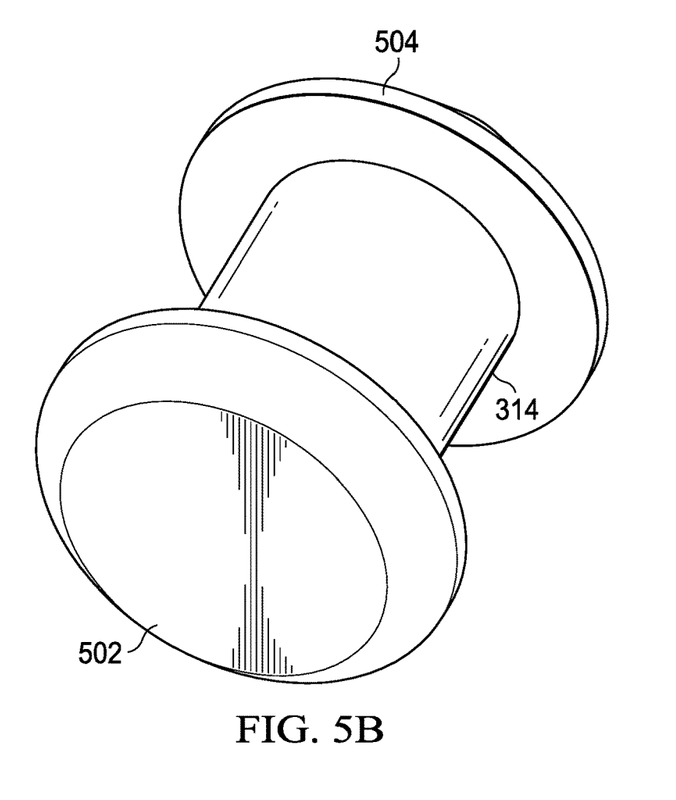
FIG. 5B illustrates an isometric view of an example plug for use in the sleeve shown in FIGS. 3, 4A, and 4B, in accordance with the present disclosure.

FIG. 5A illustrates a side elevation view of example plug 314 for use in sleeve 108B, in accordance with the present disclosure. FIG. 5B illustrates an isometric view of example plug 314, in accordance with the present disclosure. As shown in FIGS. 5A and 5B, a plug 314 may have a top feature 502 and a bottom feature 504. Each of top feature 502 and bottom feature 504 may be shaped (e.g., in terms of size and geometric shape) to hold a plug 314 in place when such plug 314 is inserted into cable passage opening 310 or storage hole 316. Each of top feature 502 and bottom feature 504 may also be shaped (e.g., in terms of size and geometric shape) to provide a fluidic seal for a cable passage opening 310 into which a plug 314 in inserted. Furthermore, top feature 502 may be shaped (e.g., in terms of size and geometric shape) to permit a user to physically interact with a plug 314 to insert and/or remove such plug 314 from a cable passage opening 310 or storage hole 316.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. An information handling system comprising:
a chassis;
a cable channel formed within the chassis; and
a sleeve within the cable channel and configured to minimize airflow recirculation in the chassis via the cable channel, the sleeve comprising:
one or more sealing features configured to mechanically couple to the cable channel and create a fluidic seal between two sides of the sleeve when the sleeve is present in the cable channel;
a cable passage opening for passage of a cable; and
an obstruction configured to create a seal at the cable passage opening in the absence of the cable from the cable passage opening, such seal restricting airflow through the cable passage opening.

2. The information handling system of claim 1, wherein the obstruction comprises a cap flexibly coupled to the sleeve and configured to be selectively translated between a closed position in which the cap creates the seal at the cable passage opening and an open position in which the cable passage opening is open for passage of the cable therethrough.

3. The information handling system of claim 1, wherein the obstruction comprises a removable plug configured to be selectively inserted into the cable passage opening to create the seal at the cable passage opening and selectively removed from the cable passage opening to open the cable passage opening for passage of the cable therethrough.

4. The information handling system of claim 3, wherein the sleeve further comprises a storage hole for receiving and storing the removable plug when the removable plug is removed from the cable passage opening.

5. The information handling system of claim 1, wherein the sleeve further comprises:
a second cable passage opening for passage of the cable or a second cable; and
a second obstruction configured to create a seal at the second cable passage opening in the absence of the cable and the second cable from the second cable passage opening, such seal restricting airflow through the cable passage opening.

6. The information handling system of claim 5, wherein the cable passage opening is shaped differently than the second cable passage opening.

7. The information handling system of claim 5, wherein the cable passage opening is sized differently than the second cable passage opening.

8. A sleeve configured to engage with a cable channel in order to minimize airflow recirculation in a chassis via a cable channel of the chassis, the sleeve comprising:
one or more sealing features configured to mechanically couple to the cable channel and create a fluidic seal between two sides of the sleeve when the sleeve is present in the cable channel;
a cable passage opening for passage of a cable; and
an obstruction configured to create a seal at the cable passage opening in the absence of the cable from the cable passage opening, such seal restricting airflow through the cable passage opening.

9. The sleeve of claim 8, wherein the obstruction comprises a cap flexibly coupled to the sleeve and configured to be selectively translated between a closed position in which the cap creates the seal at the cable passage opening and an open position in which the cable passage opening is open for passage of the cable therethrough.

10. The sleeve of claim 8, wherein the obstruction comprises a removable plug configured to be selectively inserted into the cable passage opening to create the seal at the cable passage opening and selectively removed from the cable passage opening to open the cable passage opening for passage of the cable therethrough.

11. The sleeve of claim 10, further comprising a storage hole for receiving and storing the removable plug when the removable plug is removed from the cable passage opening.

12. The sleeve of claim 8, further comprising:
a second cable passage opening for passage of the cable or a second cable; and
a second obstruction configured to create a seal at the second cable passage opening in the absence of the cable and the second cable from the second cable passage opening, such seal restricting airflow through the cable passage opening.

13. The sleeve of claim 12, wherein the cable passage opening is shaped differently than the second cable passage opening.

14. The sleeve of claim 12, wherein the cable passage opening is sized differently than the second cable passage opening.

15. A method for forming a sleeve configured to engage with a cable channel in order to minimize airflow recirculation in a chassis via a cable channel of the chassis, the method comprising:
forming one or more sealing features configured to mechanically couple to the cable channel and create a fluidic seal between two sides of the sleeve when the sleeve is present in the cable channel;
forming in the sleeve a cable passage opening for passage of a cable; and
forming an obstruction configured to create a seal at the cable passage opening in the absence of the cable from the cable passage opening, such seal restricting airflow through the cable passage opening.

16. The method of claim 15, wherein the obstruction comprises a cap flexibly coupled to the sleeve and configured to be selectively translated between a closed position in which the cap creates the seal at the cable passage opening and an open position in which the cable passage opening is open for passage of the cable therethrough.

17. The method of claim 15, wherein the obstruction comprises a removable plug configured to be selectively inserted into the cable passage opening to create the seal at the cable passage opening and selectively removed from the cable passage opening to open the cable passage opening for passage of the cable therethrough.

18. The method of claim 17, further comprising a storage hole for receiving and storing the removable plug when the removable plug is removed from the cable passage opening.

19. The method of claim 15, further comprising:
a second cable passage opening for passage of the cable or a second cable; and
a second obstruction configured to create a seal at the second cable passage opening in the absence of the cable and the second cable from the second cable passage opening, such seal restricting airflow through the cable passage opening.

20. The method of claim 19, wherein the cable passage opening is shaped differently than the second cable passage opening.

21. The method of claim 19, wherein the cable passage opening is sized differently than the second cable passage opening.

* * * * *